United States Patent [19]

Fujii et al.

[11] Patent Number: 5,043,184

[45] Date of Patent: Aug. 27, 1991

[54] METHOD OF FORMING ELECTRICALLY CONDUCTING LAYER

[75] Inventors: Ryuichi Fujii, Urawa; Osamu Ogitani; Toru Shirose, both of Koshigaya, all of Japan

[73] Assignee: Somar Corporation, Japan

[21] Appl. No.: 457,530

[22] Filed: Dec. 27, 1989

[30] Foreign Application Priority Data

Feb. 6, 1989 [JP] Japan ................................. 1-27292
Feb. 6, 1989 [JP] Japan ................................. 1-27293

[51] Int. Cl.⁵ .............................................. C23C 26/00
[52] U.S. Cl. ...................................... 427/96; 427/302; 427/386
[58] Field of Search ........................... 427/96, 302, 386

[56] References Cited

U.S. PATENT DOCUMENTS

| | | | |
|---|---|---|---|
| 4,400,460 | 8/1983 | Fickes et al. | 430/306 |
| 4,411,989 | 10/1983 | Haney. | |
| 4,416,914 | 11/1983 | Eichelberger | 427/386 |
| 4,572,764 | 2/1986 | Fan | 427/96 |
| 4,604,799 | 8/1986 | Gurol | 427/96 |
| 4,623,559 | 11/1986 | Hudock | 427/96 |
| 4,713,137 | 12/1987 | Sexton | 427/96 |
| 4,801,489 | 1/1989 | Nakagawa | 427/96 |

FOREIGN PATENT DOCUMENTS

| | | | |
|---|---|---|---|
| 6159012 | 12/1981 | Japan | 427/386 |
| 6159014 | 12/1981 | Japan | 427/386 |
| 196237 | 11/1983 | Japan | 427/302 |
| 88/05252 | 7/1988 | PCT Int'l Appl. | 427/96 |

*Primary Examiner*—Shrive P. Beck
*Assistant Examiner*—Vi Duong Dang
*Attorney, Agent, or Firm*—Lorusso & Loud

[57] ABSTRACT

A conducting layer such as an additional wiring pattern or an electromagnetic insulation layer is formed on a conducting surface such as of a printed circuit board with an insulating layer being interposed therebetween, by a method which includes the steps of:

(a) providing a liquid thermosetting composition containing an epoxy resin, a curing agent, a polymerizable compound having at least two acrylate or methacrylate groups and a photopolymerization initiator;
(b) applying the composition to the conducting surface to form a coated layer;
(c) irradiating actinic light on the coated layer to polymerize the polymerizable compound and to obtain a solid, thermosetting layer,
(d) heating the thermosetting layer to cure the epoxy resin and to form the insulating layer; and
(e) forming an electrically conducting layer on the cured resin layer. Steps (b) and (c) are repeated until the solid thermosetting layer has a desired thickness. Step (d) may be performed before or after step (e).

22 Claims, No Drawings

METHOD OF FORMING ELECTRICALLY CONDUCTING LAYER

BACKGROUND OF THE INVENTION

1. Field of the Invention

This invention relates to a method of forming an electrically conducting layer over an electrically conducting surface with an electrically insulating layer being interposed therebetween. The present invention is also related to a method of forming a thermosetting resin layer on a surface of a substrate.

2. The Prior Art

When an electrically insulating layer is provided over an electrically conducting surface, such as in manufacturing multi-layered, printed circuit boards or in effecting electromagnetic shielding of printed circuit boards, there has been hitherto employed a method in which a coating composition containing a phenol resin, an epoxy resin or the like resin is applied on a surface to be insulated and the resulting coat is dried and thermally treated. The conventional method has a problem because it is difficult to form an insulating layer having a large thickness and having no pin holes or like coating failure. Thus, it is necessary to repeat the coating and curing treatment a number of times. This is time consuming.

Japanese Published Unexamined Patent Application (Tokkyo Kokai) No. 63-154,780 discloses a method wherein an adhesive composition containing (I) a mixture of (a) a thermosetting epoxymethacrylate resin obtained by addition polymerization of methacrylic acid with an epoxy resin (b) a copolymerizable crosslinking agent and (c) a thermal polymerization initiator, (II) a mixture of an epoxy resin and a curing agent, and (III) a filler and a thixotropic agent is applied to a substrate, the applied coating being subsequently heated at a low temperature to cure the ingredients (I) and then at a high temperature to cure the ingredients (II). This prior art publication neither recognizes the problem of formation of pin holes nor suggests the solution thereof.

SUMMARY OF THE INVENTION

In accordance with one aspect of the present invention there is provided a method of making an electrically conducting layer over an electrically conducting surface with an electrically insulating layer being interposed therebetween, said method comprising the steps of:

(a) providing a liquid thermosetting composition containing an epoxy resin, a curing agent, a polymerizable compound having at least two acrylate or methacrylate groups and a photopolymerization initiator;

(b) applying the composition to the conducting surface to form a coated layer;

(c) irradiating actinic light on the coated layer to polymerize the polymerizable compound and to obtain a solid, thermosetting layer, (d) heating the thermosetting layer to cure the epoxy resin and to form the insulating layer; and (e) forming an electrically conducting layer on the cured resin layer.

In another aspect, the present invention provides a method of making an electrically conducting layer over an electrically conducting surface with an electrically insulating layer being interposed therebetween, said method comprising the steps of:

(a) providing a liquid thermosetting composition containing an epoxy resin, a curing agent, a polymerizable compound having at least two acrylate or methacrylate groups and a photopolymerization initiator;

(b) applying the composition to the conducting surface to form a coated layer;

(c) irradiating actinic light on the coated layer to polymerize the polymerizable compound and to obtain a solid, thermosetting layer, (d) laminating an electrically conducting film on the thermosetting layer to form the conducting layer thereon, and (e) heating the thermosetting layer to cure the epoxy resin and to form the insulating layer.

The present invention also provides a method of making a thermosetting layer over a substrate, comprising the steps of:

(a) providing a liquid thermosetting composition containing an epoxy resin, a curing agent, a polymerizable compound having at least two acrylate or methacrylate groups and a photopolymerization initiator;

(b) applying the composition to a surface of the substrate to form a coated layer; and (c) irradiating actinic light on the coated layer to polymerize the polymerizable compound and to obtain a solid, thermosetting layer, steps (b) and (c) being alternately repeated until the thermosetting layer has a desired thickness.

The present invention is suitably applied to the manufacture of multi-layered printed circuit boards or to the formation of electromagnetic shielding layers over printed circuit boards.

DESCRIPTION OF THE PREFERRED EMBODIMENTS

The present invention will now be described in detail below.

In the present invention a thermosetting resin composition containing an epoxy resin, a curing agent, a polymerizable compound having at least two acrylate or methacrylate groups, and a photopolymerization initiator is used.

The epoxy resin is suitably a liquid epoxy resin having two or more epoxy groups in its molecule. Examples of suitable epoxy resins include glycidyl ethers of bisphenol A, bisphenol F, bisphenol AD, brominated bisphenol A, glycerin and a polyalkylene oxide; glycidyl esters of dimer acid and isophthalic acid; epoxidized polybutadiene obtained by reaction of polybutadiene with peracetic acid; heterocyclic epoxy resins; and mixtures thereof. Above all, the use of glycidyl ethers of bisphenol A, bisphenol F and bisphenol AD is particularly preferred. Crystalline or solid epoxy resins may be used for the purpose of the invention as long as they can be dissolved in other ingredients of the thermosetting composition such as a (meth)acrylate-containing polymerizable compound which is generally liquid at room temperature. Examples of such solid epoxy resins include glycidyl ethers of resorcin and hydroquinone.

As the curing agent a maleimide-triazine resin is preferably used. The maleimide-triazine resin is an addition polymerization type thermosetting polyimide resin having cyanato groups and comprising a maleimide component and a triazine resin component. It can be obtained by reacting a polyfunctional maleimide compound with a polyfunctional cyanate compound in the presence or absence of a catalyst under heating. In this case, the cyanate compound forms a triazine ring upon being heated. As the catalyst for this reaction, an organic metal salt, a tertiary amine, etc. may be used.

As the aforesaid polyfunctional maleimide compound, there can be used, for example, those which are represented by the following general formula (I):

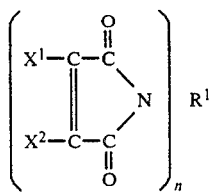

wherein $R^1$ represents an aromatic or alicyclic organic group having a valence number of 2 to 5, preferably 2, $X^1$ and $X^2$, independently from each other, represent hydrogen, halogen or alkyl, and n represents an integer of 2 to 5 corresponding to the valence number of $R^1$.

The polyfunctional maleimide compound represented by the foregoing general formula (I) can be prepared by reacting a maleic anhydride compound with a polyvalent amino compound in a conventional manner to form a maleamic acid compound, subjecting the maleamic acid compound to dehydrative cyclization. As the polyvalent amino compound, there may be used, for example, phenylenediamine, xylylenediamide, cyclohexanediamine, 4,4'-diaminobiphenyl, bis(4-aminophenyl)methane, bis(4-aminophenyl)ether, bis(4-amino-3-methylphenyl)methane, 2,2-bis(4-aminophenyl)propane, 2,2-bis(4-amino-3-methylphenyl)propane, 2,2-bis(4-amino-3-chlorophenyl)propane and 1,1-bis(4-aminophenyl)-1-phenylethane.

As the aforesaid polyfunctional cyanate compound, there may be used, for example, those which are represented by the following general formula:

$$R^2(OCN)_m \qquad (III)$$

wherein $R^2$ represents an aromatic group having a valence number of 2 to 5, preferably 2, and m represents an integer of 2 to 5 corresponding to the valence number of $R^2$.

As the polyfunctional cyanate compound represented by the above general formula (II), there may be used, for example, dicyanatobenzene, tricyanatobenzene, dicyanatonaphthalene, 4,4-dicyanatobiphenyl, bis(4-dicyanatophenyl)methane, 2,2-bis(4-cyanatophenyl)propane, 2,2-bis(3,5-dichloro-4-cyanatophenyl)propane, and bis(4-cyanatophenyl)ether.

In preparing the maleimide-triazine resin, the weight ratio of the maleimide compound to the cyanate compound is 10:90 to 40:60, preferably 20:80 to 30:70. If the amount of maleimide compound component is less than the lower limit of the above range, the resulting resin becomes poor in heat resistance. On the other hand, if more than the upper limit of the above range is used, the content of cyanate compound component (cyanato group: —OCN) becomes so small that the resulting resin cannot sufficiently function as a curing agent for the epoxy resin. The maleimide-triazine resin can be used in a liquid or solid state. The maleimide-triazine resin reacts as a curing agent with the epoxy resin to finally give a thermoset product having excellent moisture-proofing property and excellent insulating properties.

The polymerizable compound having at least two (meth)acrylate groups is a monomer or oligomer having two or more acrylic ester or methacrylic ester groups. Illustrative of suitable polyfunctional polymerizable compounds are as follows:
1,4-butanediol di(meth)acrylate;
1,6-hexanediol di(meth)acrylate;
(poly)ethylene glycol di(meth)acrylate;
(poly)propylene glycol di(meth)acrylate;
neopentyl glycol di(meth)acrylate;
neopentyl glycol hydroxypivalate di(meth)acrylate;
bis (meth)acryloxyethyl hydroxyethyl isocyanurate;
tris (meth)acryloxyethyl isocyanurate;
ethylene oxide-modified bisphenol A di(meth)acrylate;
propylene oxide-modified bisphenol A di(meth)acrylate;
trimethylolpropane tri(meth)acrylate;
pentaerythritol tri(meth)acrylate;
pentaerythriaol tetra(meth)acrylate;
dipentaerythritol hexa(meth)acrylate;
an oligoester poly(meth)acrylate prepared from a polybasic acid, polyol and (meth)acrylic acid or from a polybasic acid and a hydroxyalkyl (meth)acrylate;
an epoxy poly(meth)acrylate prepared by reaction of an epoxy resin with (meth)acrylic acid; and
an urethanated poly(meth)acrylate prepared by reaction of a polyisocyanate with a polyol and a hydroxyalkyl (meth)acrylate.

In addition, a monofunctional (meth)acrylic ester compound may also be used in conjunction with the polyfunctional polymerizable compound as a reactive diluent. The reactive diluent is used in an amount of 0–70% by weight, preferably 0–60% by weight based on the total weight of the polymerizable compound and the diluent. Examples of such diluents include:
2-hydroxyethyl (meth)acrylate;
2-hydroxypropyl (meth)acrylate;
polyethylene glycol mono(meth)acrylate;
polypropylene glycol mono(meth)acrylate;
polycaprolactone mono(meth)acrylate;
methoxyethyl (meth)acrylate;
ethoxyethyl (meth)acrylate;
butoxyethyl (meth)acrylate;
methylcarbitol (meth)acrylate;
ethylcarbitol (meth)acrylate;
butylcarbitol (meth)acrylate;
(alkyl-substituted)phenoxy (poly)ethylene glycol (meth)acrylate;
(alkyl-substituted)phenoxy (poly)propylene glycol (meth)acrylate;
dicyclopentanyl (meth)acrylate;
dicyclopentenyl (meth)acrylate;
dicyclopentenyoxyethyl (meth)acrylate;
isobornyl (meth)acrylate;
tetrahydrofurfuryl (meth)acrylate;
2-hydroxy-3-phenoxypropyl (meth)acrylate;
(meth)acryloyloxyethyl monophthalate; and
acryloylmorpholine.

As the photopolymerization initiators, any of those compounds which can generate radicals upon being irradiated with actinic light such as ultraviolet rays may be used. Examples thereof include benzopohenone, benzyl, p,p'-bis(dimethylamino)benzophenone, p,p'-bis(diethylamino)benzophenone, p,p'-dibenzoylbenzene, benzoin methyl ether, benzoin ethyl ether, benzoin propyl ether, benzyl dimethyl ketal, 1-hydroxycyclohexyl phenyl ketone, 2-hydroxy-2-methyl-1-phenylpropane-1-one, 1-(4-isopropylphenyl)-2-hydroxy-2-methylpropane-1-one, anthraquinone, acetonaphthenequinone, 1-tert-butylanthraquinone, phenanthreneanthraquinone, p,p'-bis(dimethylamino)thiobenzophenone, primulin, carbazole, N-methyl-3-nitrocatbazole, xanthone, thioxanthone, chlorothioxanthone, diethylthioxanthone, diisopropylthixanthone, carbon tetrabtomide, ω,ω,ω-tribromomethyl phenyl sulfone, and ω,ω,ω-tribromomethyl phenyl ketone.

The proportions of the epoxy resin (ingredient (a)), maleimide-triazine compound (ingredient (b)), polymerizable compound (ingredient (c)), polymerization initiator (ingredient (d)) and reactive diluent (optional ingredient (e)) in the thermosetting composition are as follows:

ingredient (a): 10–70% by weight,
ingredient (b): 10–70% by weight,
ingredients (c)+(e): 5–60% by weight, and
ingredient (d): 0.1–10% by weight,
based on the total weight of ingredients (a), (b), (c) and (e). The amount of ingredient (e) is 0–70% by weight based on the total amount of ingredients (c) and (e).

Preferred amounts of ingredients (a) through (e) are as follows:

ingredient (a): 20–60% by weight,
ingredient (b): 20–60% by weight,
ingredients (c)+(e): 10–50% by weight, and
ingredient (d): 1–6% by weight,
based on the total weight of ingredients (a), (b) (c) and (e). The preferred amount of ingredient (e) is 0–60% by weight based on the total amount of ingredients (c) and (e).

As the curing agent, there may be used any other conventional one. Such a curing agent is preferably a latent curing agent which can react with the epoxy resin at an elevated temperature of, for example 60° C. or more, preferably 100° C. or more, for example, an aromatic amine, (e.g. diaminodiphenylsulfone), a boron trifluoride-amine complex, an organometallic compound, an acid anhydride (e.g. methylnagic anhydride or methyltetrahydrophthalic anhydride), a phenol compound, a novolak phenol resin and a nitrogen-containing compound. Of these the use of a nitrogen-containing compound is especially preferred. Illustrative of suitable nitrogen-containing compounds are dicyanodiamide, a guanamine (e.g. acetoguanamine or benzoguanamine), a hydrazide (e.g. adipodihydrazide, stearodihydrazide, isophthalodihydrazide or sebacohydrazide), a triazine compound (e.g. 2,4-dihydrazide-6-methylamino-S-triazine) and an imidazole or its derivative.

It is preferred that a curing accelerator be used in conjunction with the curing agent. Such a promoter may be, for example, (1) a urea compound such as 3-substituted-1,1-dimethylureas, (2) a solid solution of 1,8-diazabicyclo(5,4,0)undecene-7 and a phenol novolak and (3) an amine adduct obtained by reacting a compound having at least two epoxy groups with a compound having both a hydroxyl group and a tertiary amino group and with an organic compound (except those having an epoxy group or a tertiary amino group) having at least two active hydrogen atoms.

Examples of suitable urea compounds are 3-(3,4-dichlorophenyl)-1,1-dimethylurea, 3-(p-chlorophenyl)-1,1-dimethylurea, 3-phenyl-1,1-dimethylurea, N,N'-(4-methyl-1,3-phenylene)-bis(N,N'-dimethylurea) and 5-(N,N'-dimethylureido)-1-(N'',N''-dimethylureidomethyl)-1,3,3-trimethylcyclohexane.

The solid solution may be obtained by heating a mixture of 1,8-diaza-bicyclo(5,4,0)undecene-7 with a phenol novolak for reaction therebetween, cooling the reaction product, and pulverizing the cooled solids. The phenol novolak is a condensation product obtained by reacting a phenol derivative with an aldehyde. Examples of the phenol derivatives include phenol, alkylphenols, alkoxyphenols, halogenated phenols, resorcinol and bisphenol A. Of these, phenol, p-tertbutylphenol and bisphenol A are particularly preferred. Examples of the aldehyde include furfuraldehyde, chloral, acetoaldehyde or formaldehyde. The content of the undecene-7 in the solid solution is preferably 10–50% by weight.

Examples of the amine adducts include polyaddition reaction products obtained from (i) 2,3-bis{4-(2,3-epoxypropoxy)phenyl}propane, 1,3-bis{4-[4-(2,3-epoxypropoxy)-α, α-dimethylbenzyl]-phenoxy}-2-propanol, (ii) condensation products obtained from phenol, formaldehyde and dimethylamine, (iii) adducts of 2-alkyl(-with 1-3 carbon atoms)imidazole or 2-alkyl(with 1-3 carbon atoms)-4-methylimidazole and 2,3-epoxypropyl phenyl ether and (iv) piperazine.

An inorganic filler is preferably incorporated into the thermosetting coating composition. Illustrative of the inorganic fillers are crystalline silica, fused silica, alumina, titania, calcium carbonate, talc, clay, calcium silicate, mica, glass fibers, glass powder, glass flakes and whiskers of various kinds. The amount of the inorganic filler is 5–80%, preferably 0–75% based on the weight of the composition (dry basis). The inorganic filler preferably has an average particle size of 5–50 μm.

In the present invention a thixotropic agent having an average particle size of 100 nm or less is preferably used. Examples of such a thixotropic agent include super-fine silica and alumina, aluminum hydroxide, fibrous magnesium oxysulfate, powdery asbestos, fibrous silica, fibrous potassium titanate, scale-like mica, and a montmorillonite-organic salt composite so-called bentonite. The thixotropic agent is used in an amount of 0.1–30 parts by weight, preferably 0.5–15 parts by weight per 100 parts by weight of the epoxy resin.

The above inorganic filler and/or the thixotropic agent are preferably pretreated with a siloxane compound. The use of the filler and thixotropic agent generally adversely affect the stability of the composition. When the filler and thixotropic agent are treated with a siloxane compound, however, the stability or shelf life is improved. Illustrative of suitable siloxane compounds are as follows:

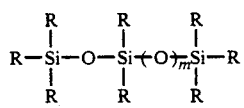

wherein R stands for a hydrocarbyl group such as methyl, ethyl, propyl, vinyl or phenyl and m is a positive integer;

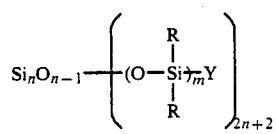

wherein R and m are as defined above and Y is hydrogen, $-OR^1$, $-R^2-CH-CH_2$, $-R^2-NH_2$, $-R^2-COOH$, $-R^2-OH$ where $R^1$ stands for a monovalent hydrocarbyl group, $R^2$ stands for a divalent hydrocarbyl group, and n is a positive integer (The hydrocarbyl group may be an aliphatic, alicyclic or aromatic);

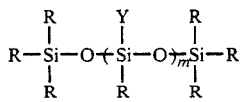

wherein R, Y and m are as defined above;

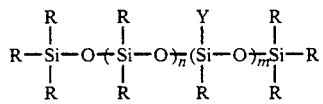

wherein R, Y, m and n are as defined above. The treatment of the filler and the thixotropic agent with the siloxane compound may be performed by mixing the filler or the thixotropic agent with a solution of the siloxane compound and, then, heating the mixture for oxidation of the siloxane compound. The above siloxane compound preferably has a viscosity of 10,000 cP or less. The amount of the siloxane compound used is 0.1–10 parts by weight, preferably 0.5–5 parts by weight per 100 parts by weight of the filler or thixotropic agent used.

The thermosetting composition may further contain, as desired, a flame retarder, a flame retarding aid, a sedimentation-preventing agent, a dispersing agent or a pigment.

In a method according to the present invention for making an electrically conducting layer over an electrically conducting surface with an electrically insulating layer being interposed therebetween, the above thermosetting composition is applied to the conducting surface to form a coated layer. This can be effected by a screen printing method, a roll coater method, a curtain coater method or the like coating method.

The coated layer is irradiated by actinic light, such as UV ray, electron beam or laser beam, to polymerize the polymerizable compound by the action of the photopolymerization initiator and to obtain a solid, thermosetting layer (or a B-stage resin layer). The application of the coating composition and the irradiation of actinic light may be alternately repeated until the resulting solid layer has a desired thickness and is free from pinholes or the like coating failure. Generally, through one cycle of the coating and irradiation, a solid layer with a thickness of 5–300 $\mu$m, preferably 10–200 $\mu$m, is obtained. The final solid layer is generally 10–600 $\mu$m desirably 20–400 $\mu$m.

The solid, thermosetting layer is then heated at a temperature of 50°–250° C., preferably 100°–200° C. to effect curing of the epoxy resin and to form an insulating layer. Thereafter, an electrically conducting layer is formed on the cured resin layer by any suitable method such as by laminating an electrically conducting film on the insulating layer, by applying a conductive coating or by plating.

The thus formed conducting layer can serve to function as an electromagnetic shielding layer. For example, when the conducting surface on which the conducting layer has been formed is a wiring pattern-bearing surface of a printed circuit board, the printed circuit board can be electromagnetically shielded by the conducting layer. It is preferable to grind the surface of the cured resin layer to form a smooth, flat surface before the formation of the conducting layer. The conducting layer may be so formed as to be electrically connected to an earth terminal of the printed circuit board.

When the electrically conducting layer is etched to form a desired wiring pattern and when the conducting surface is a wiring pattern-bearing surface of a printed circuit board, there is obtainable a multi-layered printed circuit board having a plurality of superimposed wiring patterns. The etching treatment may be carried out in any known manner, such as by a method including the steps of providing a photosensitive resin layer over the laminated conducting film (e.g. copper foil), exposing the photosensitive resin layer to actinic light, developing the exposed layer, etching the conducting film and removing the resin layer.

Such a multi-layered printed circuit board may be also obtained by forming a cured resin layer on a first wiring pattern-bearing surface of a printed circuit board in a manner as described above, and then subjecting the resin layer to a plating treatment to form a second wiring pattern. The plating treatment may be effected by coating the cured resin layer with an adhesive, followed by an electroless plating catalyzer treatment, formation of a plating resist layer and an electroless plating treatment.

In either case, the starting printed circuit board used can bear wiring patterns on both sides thereof and two additional patterns are formed thereon by the above-described technique to form a four-layered printed circuit board.

In the above method, the formation of the conducting layer is preceded by curing of the B-stage resin layer. In an alternative embodiment according to the present invention, such a curing treatment is conducted after the lamination of an electrically conducting film, such as a copper foil, on the uncured, B-stage resin layer. The resulting conducting layer as such serves as an electromagnetic shielding layer or may be further processed by etching to form a desired pattern.

As will be seen from the foregoing, the formation of a solid, thermosetting resin layer (B-stage resin layer) may be carried out by repeating the application of the coating composition and the irradiation of actinic light so that the resin layer is substantially free of pin holes or the like defects. Further, the applied coating layer may be readily solidified by photopolymerization within a short period of time (generally 5–60 seconds) by exposure to actinic light. Since the epoxy resin remains substantially uncured during the photopolymerization, solid resin layer having uniform quality may be obtained with good reproducibility in a stable manner.

The following examples will further illustrate the present invention.

EXAMPLE 1

A coating composition with the formulation shown below was coated, by screen printing using a 200 mesh screen, over a wiring pattern-bearing surface of a printed circuit board. The resulting board was conveyed at a moving speed of 4 m/minute beneath two high-pressure mercury lamps (80 W/cm) to irradiate UV rays on the coated layer. Similar coating and irradiation steps were repeated once more thereby to form a B-stage resin layer on the board.

| Ingredients | Amount (parts by weight) |
| --- | --- |
| Epikote 1001 *1 | 60 |
| MANDA *2 | 40 |
| Initiator *3 | 2 |
| 2-Ethyl-4-methylimidazole | 2 |
| Aerosil #200 *4 | 1 |

*1: Bisphenol A epoxy resin, weight epoxy equivalent: 450–500 (manufactured by Yuka-Shell Epoxy Inc.)
*2: Hydroxypivalic acid neopentylglycol diacrylate
*3: 1-Hydroxycyclohexyl phenyl ketone
*4: Superfine synthetic silica (manufactured by Japan Aerosil Inc.)

The resulting board was heated at 150° C. for 1 hour to cure the B-stage resin layer. A conductive coating composition (copper paste) was then applied onto the cured layer to form an electromagnetic shielding layer.

EXAMPLE 2

Example 1 was repeated in the same manner as described except that the following coating composition was used:

| Ingredients | Amount (parts by weight) |
| --- | --- |
| Epikote 1001 *1 | 30 |
| BT-2100 *5 | 30 |
| MANDA *2 | 40 |
| Initiator *3 | 2 |
| Aerosil #200 *4 | 2 |

*1–4: the same as above
*5: Bismaleimide-triazine resin (manufactured by Mitsubishi Gas Chemicals Co., Ltd.)

EXAMPLE 3

A coating composition with the formulation shown below was coated, by screen printing using a 70 mesh screen, over a wiring pattern-bearing surface of a printed circuit board. The resulting board was conveyed at a moving speed of 3 m/minute beneath two high-pressure mercury lamps (80 W/cm) to irradiate UV rays on the coated layer. Similar coating and irradiation steps were repeated once more thereby to form a B-stage resin layer on the board.

| Ingredients | Amount (parts by weight) |
| --- | --- |
| Epikote 828 *6 | 30 |
| BT-2100 *5 | 40 |
| MANDA *2 | 30 |
| Initiator *3 | 2 |
| Aerosil #200 *4 | 1 |

*1–5: the same above
*6: Bisphenol A epoxy resin, weight epoxy equivalent: 184–194, manufactured by Yuka-Shell Epoxy Inc.

A copper foil with a thickness of 18 um was superposed on the B-stage resin layer of the board and the assembly was heated at 120° C. for bonding. The resulting laminate was then heated at 150° C. for 1 hour to cure the B-stage resin layer, whereby the board was electromagnetically shielded by the copper foil.

EXAMPLE 4

A coating composition with the formulation shown below was coated, by screen printing using a 200 mesh screen, over two, opposite wiring pattern-bearing surfaces of a printed circuit board. The resulting board was conveyed at a moving speed of 4 m/minute between a pair of dual high-pressure mercury lamps (80 W/cm) to irradiate UV rays on both of the coated layers. Similar coating and irradiation steps were repeated once more thereby to form a B-stage resin layer on each side of the board.

| Ingredients | Amount (parts by weight) |
| --- | --- |
| Epikote 828 *6 | 50 |
| MANDA *2 | 40 |
| TMPTA *7 | 10 |
| Initiator *3 | 2 |
| 2-Ethyl-4-methylimidazole | 2 |

*2, 3 and 6: the same above
*7: Trimethylolpropane triacrylate

The resulting board was heated at 150° C. for 1 hour to cure the B-stage resin layer. An adhesive layer containing a catalyser of electroless plating was then applied to both cured resin layers, followed by formation of plating resist layers of a negative pattern and electroless plating of copper, whereby four-layered printed circuit board was obtained.

EXAMPLE 5

A coating composition with the formulation shown below was coated, by screen printing using a 70 mesh screen, over two, opposite wiring pattern-bearing surfaces of a printed circuit board. The resulting board was conveyed at a moving speed of 3 m/minute between a pair of dual high-pressure mercury lamps (80 W/cm) to irradiate UV rays on each coated layer. Similar coating and irradiation steps were repeated once more thereby to form a B-stage resin layer on each side of the board.

| Ingredients | Amount (parts by weight) |
| --- | --- |
| Epikote 1001 *1 | 30 |
| BT-2100 *5 | 40 |
| MANDA *2 | 25 |
| TMPTA *7 | 5 |
| Initiator *3 | 2 |

*1–7: the same above

A copper foil with a thickness of 18 um was superposed on each of the B-stage resin layers of the board and the assembly was heated at 80° C. for 1 hour to cure the B-stage resin layer. An etching resist layer was then formed on each copper layer, followed by etching and removal of the resin layer, thereby to obtain a four-layered printed circuit board.

EXAMPLE 6

Thermosetting compositions composed of the ingredients shown in Table below were prepared.

| Ingredient (parts by weight) | Composition No. 1 | 2 | 3 |
| --- | --- | --- | --- |
| Epikote 828 *6 | | | 30 |
| Epikote 1001 *1 | 30 | 40 | |
| BT-2100 *5 | 30 | 40 | 30 |
| MANDA *2 | 40 | 20 | |
| TMPTA *7 | | | 30 |
| Diluent *8 | | | 10 |
| Initiator *3 | 2 | 2 | 2 |
| Aerosil #200 *4 | 2 | 2 | 2 |
| Insulation (ohm) | | | |
| Initial | $5.5 \times 10^{14}$ | $4.5 \times 10^{14}$ | $5.0 \times 10^{14}$ |
| After boiling | $1.5 \times 10^{13}$ | $2.0 \times 10^{13}$ | $1.0 \times 10^{13}$ |

*1–7: the same as above
*8: Butoxyethyl acrylate

Each of the thermosetting compositions No. 1-3 was coated by screen printing on an IPC-B25 comb-like electrode using a 200 mesh screen and the coat was irradiated by UV rays. Such a printing and irradiation operation was repeated 3 times. The resulting B-stage resin coat was then cured at 150° C. for 1 hour. The resulting electrodes bearing the cured resin layers were tested for their electrical insulation by measuring electric resistivity at an impressed voltage of 500 V before and after immersion in boiling water for 2 hours. The results are also summarized in Table above. From the results shown, it will be seen that the cured resin exhibits excellent moisture-proofing property and excellent electrically insulating property.

We claim:

1. A method of making an electrically conducting layer over an electrically conducting surface with an electrically insulating layer being interposed therebetween, said method comprising the steps of:
    (a) providing a liquid thermosetting composition containing an epoxy resin, a curing agent, a polymerizable compound having at least two acrylate or methacrylate groups and a photopolymerization initiator;
    (b) applying the composition to the conducting surface to form a coated layer;
    (c) irradiating actinic light on the coated layer to polymerize the polymerizable compound and to obtain a solid, thermosetting layer,
    (d) heating the thermosetting layer to cure the epoxy resin and to form the insulating layer; and
    (e) forming an electrically conducting layer on the cured resin layer.

2. A method according to claim 1, wherein step (e) is effected by laminating an electrically conducting film on the insulating layer.

3. A method according to claim 1, wherein step (e) is effected by plating.

4. A method according to claim 2, wherein said conducting surface is a wiring pattern-bearing surface of a printed circuit board.

5. A method according to claim 4, further comprising etching the electrically conducting layer to form a second wiring pattern on the insulating layer.

6. A method according to claim 3, wherein said conducting surface is a wiring pattern-bearing surface of a printed circuit board.

7. A method according to claim 3, wherein said plating is performed so that the conducting layer forms a second wiring pattern.

8. A method according to claim 1, wherein said electrically conducting layer functions to effect electromagnetic shielding.

9. A method according to claim 1, wherein said curing agent includes a maleimide-triazine resin.

10. A method according to claim 1, wherein steps (b) and (c) are alternately repeated until the thermosetting layer has a desired thickness.

11. A method of making an electrically conducting layer over an electrically conducting surface with an electrically insulating layer being interposed therebetween, said method comprising the steps of:
    (a) providing a liquid thermosetting composition containing an epoxy resin, a curing agent, a polymerizable compound having at least two acrylate or methacrylate groups and a photopolymerization initiator;
    (b) applying the composition to the conducting surface to form a coated layer;
    (c) irradiating actinic light on the coated layer to polymerize the polymerizable compound and to obtain a solid, thermosetting layer,
    (d) laminating an electrically conducting film on the thermosetting layer to form the conducting layer thereon, and '(e) heating the thermosetting layer to cure the epoxy resin and to form the insulating layer.

12. A method according to claim 11, wherein said conducting surface is a wiring pattern-bearing surface of a printed circuit board.

13. A method according to claim 12, further comprising etching the electrically conducting layer to form a second wiring pattern on the insulating layer.

14. A method according to claim 11, wherein said conducting layer functions to effect electromagnetic shielding.

15. A method according to claim 11, wherein said curing agent includes a maleimide-triazine resin.

16. A method according to claim 11, wherein steps (b) and (c) are alternately repeated until the thermosetting layer has a desired thickness.

17. A method of making a thermosetting layer over a substrate, comprising the steps of:
    (a) providing a liquid thermosetting composition containing an epoxy resin, a curing agent, a polymerizable compound having at least two acrylate or methacrylate groups and a photopolymerization initiator;
    (b) applying the composition to a surface of the substrate to form a coated layer; and
    (c) irradiating actinic light on the coated layer to polymerize the polymerizable compound and to obtain a solid, thermosetting layer, steps (b) and (c) being alternately repeated until the thermosetting layer has a desired thickness.

18. A method according to claim 17, further comprising the step of:
    (d) heating the thermosetting layer to cure the epoxy resin and to form an electrically insulating layer.

19. A method according to claim 17, wherein said curing agent includes a maleimide-triazine resin.

20. The method of claim 1 further comprising:
    (f) forming a layer of photosensitive resin on said electrically conducting layer.

21. The method of claim 20 further comprising:
    exposing said photosensitive resin to form an image of a wiring pattern;
    etching said electrically conducting layer to form said wiring pattern.

22. The method of claim 1 wherein said irradiating polymerizes the polymerizable compound to form a B-stage thermosetting resin layer and wherein said B-stage layer is cured by said heating.

* * * * *

UNITED STATES PATENT AND TRADEMARK OFFICE
CERTIFICATE OF CORRECTION

PATENT NO. : 5,043,184
DATED : August 27, 1991
INVENTOR(S) : Fujii et al It is certified that error appears in the above-identified patent and that said Letters Patent is hereby corrected as shown below:

Col. 6, line 7, "p-tertbutyl-" should read --p-tert-butyl- --; and line 28, "0-75%" should read --20-75%--.

Col. 10, line 44, after "for" insert --bonding. The resulting laminate was then heated at 150° C for--.

Col. 12, line 13, "'(e)" should read --(e)--; and "(e)" should begin a new paragraph.

Signed and Sealed this

Nineteenth Day of January, 1993

*Attest:*

DOUGLAS B. COMER

*Attesting Officer*   *Acting Commissioner of Patents and Trademarks*